(12) United States Patent
Engblom et al.

(10) Patent No.: US 9,280,064 B2
(45) Date of Patent: Mar. 8, 2016

(54) LITHOGRAPHIC METHOD AND APPARATUS

(71) Applicants: Peter David Engblom, Meridian, ID (US); Carsten Andreas Köhler, Veldhoven (NL); Frank Staals, Eindhoven (NL); Laurentius Cornelius De Winter, Vessem (NL)

(72) Inventors: Peter David Engblom, Meridian, ID (US); Carsten Andreas Köhler, Veldhoven (NL); Frank Staals, Eindhoven (NL); Laurentius Cornelius De Winter, Vessem (NL)

(73) Assignee: ASML NETHERLANDS B.V., Veldhoven (NL)

( * ) Notice: Subject to any disclaimer, the term of this patent is extended or adjusted under 35 U.S.C. 154(b) by 584 days.

(21) Appl. No.: 13/685,467

(22) Filed: Nov. 26, 2012

(65) Prior Publication Data

US 2013/0141706 A1  Jun. 6, 2013

Related U.S. Application Data

(60) Provisional application No. 61/566,334, filed on Dec. 2, 2011.

(51) Int. Cl.
- *G03F 7/20* (2006.01)
- *G03F 1/36* (2012.01)
- *G03F 1/00* (2012.01)

(52) U.S. Cl.
CPC .......... *G03F 7/70425* (2013.01); *G03F 1/144* (2013.01); *G03F 1/36* (2013.01); *G03F 7/70433* (2013.01); *G03F 7/70441* (2013.01)

(58) Field of Classification Search
CPC .......... G03F 7/70425; G03F 7/70433; G03F 7/70441; G03F 1/36; G03F 1/144
USPC .......... 355/30, 52, 53, 55, 67–71, 77
See application file for complete search history.

(56) References Cited

U.S. PATENT DOCUMENTS

| | | |
|---|---|---|
| 6,355,382 B1 | 3/2002 | Yasuzato et al. |
| 6,934,010 B2 | 8/2005 | Smith |
| 7,317,511 B2 | 1/2008 | Yamazoe |
| 7,525,640 B2 | 4/2009 | Jansen et al. |
| 8,810,773 B2 | 8/2014 | Akhssay |
| 2009/0316125 A1 | 12/2009 | Finders |
| 2010/0123887 A1 | 5/2010 | De Winter et al. |
| 2010/0129742 A1 | 5/2010 | De Winter et al. |
| 2010/0265479 A1 | 10/2010 | De Winter et al. |
| 2011/0116065 A1 | 5/2011 | Akhssay |

FOREIGN PATENT DOCUMENTS

| | | |
|---|---|---|
| JP | H10-041220 | 2/1998 |
| JP | 2004-71776 | 3/2004 |
| JP | 2006-245270 | 9/2006 |
| JP | 2007-149807 | 6/2007 |
| JP | 2011-109088 | 6/2011 |
| TW | 201137535 | 11/2011 |

*Primary Examiner* — Toan Ton
*Assistant Examiner* — Mona M Sanei
(74) *Attorney, Agent, or Firm* — Pillsbury Winthrop Shaw Pittman LLP

(57) ABSTRACT

A method of projecting a pattern from a patterning device onto a substrate using a projection system, the method including using an optical phase adjustment apparatus in the projection system to apply a phase modification to radiation which has been diffracted from an assist feature of the pattern, the phase modification acting to reduce the size of an assist feature image exposed in resist on the substrate or prevent printing of the assist feature image in the resist on the substrate, while maintaining a contribution of the assist feature image to an image enhancement of a functional feature of the pattern.

20 Claims, 7 Drawing Sheets

LITHOGRAPHIC METHOD AND APPARATUS

This application claims priority and benefit under 35 U.S.C. §119(e) to U.S. Provisional Patent Application No. 61/566,334, filed on Dec. 2, 2011. The content of that application is incorporated herein in its entirety by reference.

FIELD

The present invention relates to a lithographic method and apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to impart a beam of radiation with a pattern in its cross-section corresponding to a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

SUMMARY

When projecting a pattern from a patterning device onto a substrate, one or more parts of the pattern may be modified in an undesirable manner. For example, a functional feature, such as a corner, may become rounded in an undesirable manner. One or more so called 'assist features' may be provided in the pattern, and may act to improve the quality of a pattern provided on a substrate (e.g., exposed in resist on a substrate). The assist feature may be a feature located adjacent to a functional feature. The assist feature acts to reduce undesirable modification of a pattern such that an improved pattern is provided on the substrate. The assist feature itself is not provided (e.g., exposed) on the substrate.

In some instances, the assist feature may be projected such that it causes resist on the substrate to not be exposed (in the case of positive resist) and therefore become visible on the substrate. This is undesirable because the assist feature is not intended to form part of a pattern on the substrate.

It is desirable to provide, for example, a method and apparatus that obviates or mitigates one or more of the problems identified herein or elsewhere, or one or more of the problems of the art in general, whether identified herein or elsewhere. For instance, it is desirable to provide a method and apparatus which may be used to reduce the extent to which an assist feature is exposed in resist on a substrate.

According to an aspect of the invention there is provided a method of projecting a pattern from a patterning device onto a substrate using a projection system, the method comprising using an optical phase adjustment apparatus in the projection system to apply a phase modification to radiation which has been diffracted from an assist feature of the pattern, the phase modification acting to reduce the size of an assist feature image exposed in resist on the substrate or prevent printing of an assist feature image in the resist on the substrate, while maintaining a contribution of the assist feature image to an image enhancement of a functional feature of the pattern.

The phase modification may reduce contrast at the substrate of the radiation diffracted from the assist feature.

The phase modification applied by the optical phase adjustment apparatus may have a lesser effect on radiation which has been diffracted from a functional feature of the pattern.

The phase modification applied by the optical phase adjustment apparatus may have a negligible effect upon a functional feature image exposed in the resist on the substrate.

The phase modification may be applied to radiation of a particular diffraction order, and not significantly applied to radiation of other diffraction orders.

The phase modification may be applied to radiation of a plurality of particular diffraction orders, and not significantly applied to radiation of other diffraction orders.

The particular diffraction order may be the 3rd diffraction order.

The phase modification may comprise reducing the optical path length of radiation which passes through a phase advancing area of the optical phase adjustment apparatus and increasing the optical path length of radiation which passes through a phase delaying area of the optical phase adjustment apparatus.

The optical path length reduction applied by the phase advancing area may be equal to the optical path length increase applied by the phase delaying area.

The optical path length reduction may vary within the phase advancing area, and the optical path length increase may vary within the phase delaying area.

The phase advancing area and the phase delaying area may be provided in a point-symmetric distribution or in a point-antisymmetric distribution.

Phase advancing areas and phase delaying areas may be provided in pairs.

The sum of the phase modification applied by all of the modifying areas of the optical phase adjustment apparatus may be zero.

According to an aspect of the invention there is provided a method of projecting a pattern from a patterning device onto a substrate using a projection system, the method comprising using an optical phase adjustment apparatus in the projection system to apply a phase modification to radiation which has been diffracted from an assist feature of the pattern, the phase modification acting to reduce the size of an assist feature image exposed in resist on the substrate or prevent printing of an assist feature image in the resist on the substrate, wherein the phase modification has a lesser effect upon radiation which has been diffracted from a functional feature of the pattern.

This method may include any of the optional features of the previous method.

According to an aspect of the invention there is provided a lithographic apparatus comprising an optical phase adjustment apparatus configured to apply a method as described herein.

According to an aspect of the invention there is provided a lithographic apparatus comprising a support structure to support a patterning device, the patterning device serving to provide a radiation beam with a pattern in its cross-section; a projection system to project the patterned radiation beam onto a target portion of a substrate; an optical phase adjustment apparatus located at or adjacent to a pupil plane of the projection system; and a controller configured to operate the optical phase adjustment apparatus to apply a phase modification to radiation which has been diffracted from an assist feature of the pattern, the phase modification acting to reduce the size of an assist feature image exposed in resist on the substrate or prevent printing of the assist feature image in the resist on the substrate, while maintaining a contribution of the assist feature image to an image enhancement of a functional feature of the pattern.

The phase modification may be configured to reduce contrast at the substrate of the radiation diffracted from the assist feature.

The phase modification applied by the optical phase adjustment apparatus may have a lesser effect on radiation which has been diffracted from a functional feature of the patterning device.

The controller may be configured to operate the optical phase adjustment apparatus to apply the phase modification to radiation of a particular diffraction order, and to not significantly apply the phase modification to radiation of other diffraction orders.

The particular diffraction order may be the 3rd diffraction order.

The phase modification may comprise reducing the optical path length of radiation which passes through a phase advancing area of the optical phase adjustment apparatus and increasing the optical path length of radiation which passes through a phase delaying area of the optical phase adjustment apparatus.

The optical path length reduction applied by the phase advancing area may be equal to the optical path length increase applied by the phase delaying area.

Phase advancing areas and the phase delaying areas may be provided in a point-symmetric distribution or in a point-antisymmetric distribution, or may be provided in a distribution which comprises a combination of a point-symmetric distribution and a point-antisymmetric distribution.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
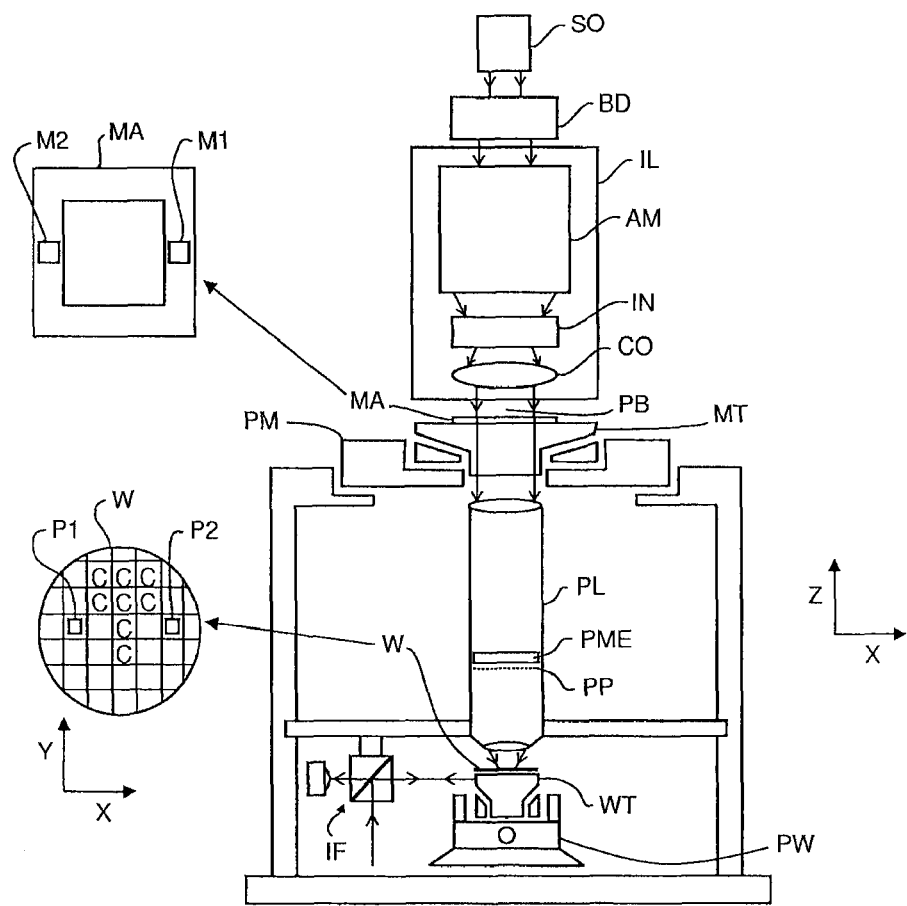
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

The terms "radiation" and "beam" used herein encompass all types of electromagnetic radiation, including ultraviolet (UV) radiation (e.g. having a wavelength of 365, 355, 248, 193, 157 or 126 nm) and extreme ultra-violet (EUV) radiation (e.g. having a wavelength in the range of 5-20 nm).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

An illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a beam PB of radiation (e.g. UV radiation or EUV radiation).

a support structure (e.g. a support structure) MT to support a patterning device (e.g. a mask) MA and connected to a first positioning device PM to accurately position the patterning device with respect to item PL;

a substrate table (e.g. a wafer table) WT to hold a substrate (e.g. a resist-coated wafer) W and connected to a second positioning device PW to accurately position the substrate with respect to item PL;

a projection system (e.g. a refractive projection lens) PL configured to image a pattern imparted to the radiation beam PB by patterning device MA onto a target portion C (e.g. comprising one or more dies) of the substrate W; and a phase modulation element PME located in or adjacent to a pupil plane PP of the projection system PL, the phase modulation element PME being arranged to adjust a phase of at least a part of an electric field of the radiation beam.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjuster AM to adjust the angular intensity distribution of the beam (e.g. for providing a desired illumination made in the radiation beam). Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. In passing through the projection system PL, the beam PB also traverses the phase modulation element PME. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path or the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
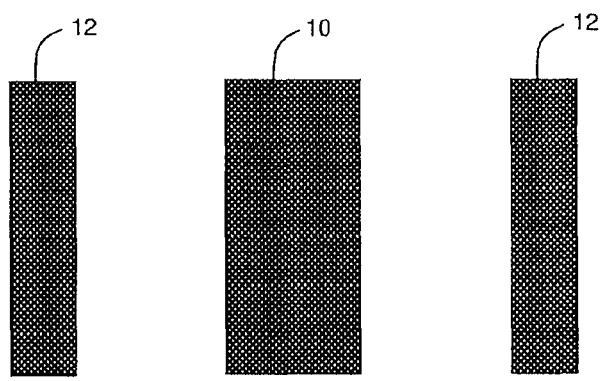
FIG. 2 schematically depicts a pattern which may be projected by the lithographic apparatus from a patterning device onto a substrate.

FIG. 2 shows schematically viewed from above a functional feature 10 which may form part of a pattern on a patterning device MA used in a lithographic apparatus (see FIG. 1). The functional feature 10 may be a so-called isolated line, that is a line which is separated from one or more neighboring pattern lines by a distance which is considerably greater than the width of the line. One or more assist features 12 (in this case, at least two) features 12 are provided adjacent (in this, on either side of) the functional feature 10. The assist feature acts to reduce undesirable modification of the functional feature 10 when the functional feature is projected by the lithographic apparatus onto a substrate W. The assist feature 12 may, for example, help to ensure that the width of an image of the functional feature 10 is a desired width (e.g., one quarter of the width of the functional feature, taking into account a reduction factor of the lithographic apparatus).

The purpose of an assist feature 12 is to assist in the correct formation of an image of the functional feature 10 without itself forming an image. Thus, e.g., a pattern exposed in resist on a target portion C of a substrate W (see FIG. 1) should not include the assist feature 12. Under some circumstances however the assist feature 12 may be exposed in the resist, an outcome which is undesirable. In order to avoid or reduce the likelihood of an assist feature 12 being exposed in the resist on a substrate W, a phase modification may be applied to radiation which has been diffracted from the assist feature 12.

In an example of the arrangement of FIG. 2, the functional feature 10 has a width of 64 nm and the assist features 12 have a width of 30 nm. There is a gap of 69 nm between the functional feature and the assist features. The pattern of the patterning device may comprise a plurality of repetitions of the features shown in FIG. 2. The distance between adjacent repetitions may be 350 nm (measured from the center of a functional feature 10 to the center of an adjacent functional feature). The dimensions referred to here are merely examples, and other dimensions may be used.

In an embodiment, an annular illumination mode may be used to illuminate the patterning device MA. Properties of the annular illumination mode may be determined by the illumination system IL of the lithographic apparatus. The annular illumination mode may have an inner sigma of 0.66 and an outer sigma of 0.86. An annular illumination mode may be used because it provides improved imaging of particular types of features from the patterning device MA onto the substrate W. Other illumination modes may be used, the selection of the illumination mode being at least in part determined by properties of the pattern of the patterning device MA.

Figure 3:
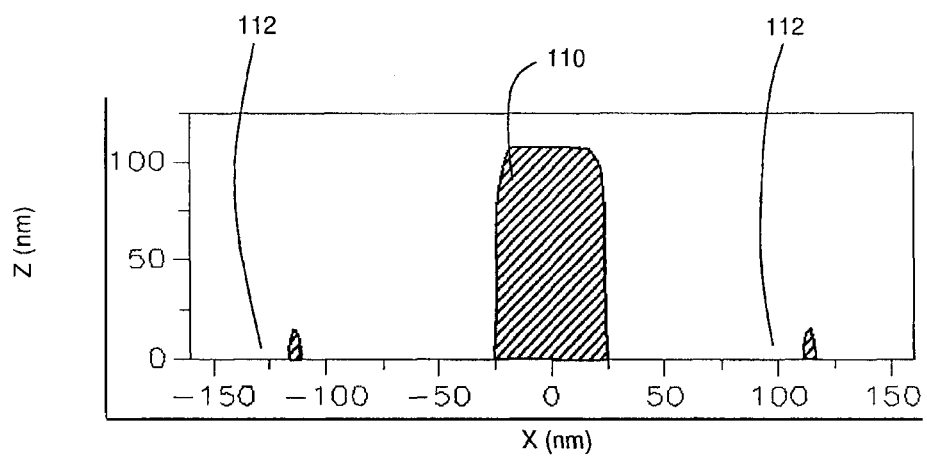
FIG. 3 schematically depicts the effect of the patterned radiation on resist provided on the substrate.

FIG. 3 schematically represents resist which is exposed when the annular illumination mode is used to illuminate a patterning device MA provided with a pattern having the arrangement of functional feature 10 and assist features 12 of FIG. 12, and when resulting patterned radiation is projected by the lithographic apparatus onto a substrate W. Resist which is exposed is represented as a white area, and resist which is not exposed is represented as cross-hatched areas. The vertical axis of FIG. 3 indicates the height of resist relative to a substrate on which the resist is provided, and the horizontal axis of FIG. 3 indicates the location of the resist in the x-direction. The horizontal axis represents x-direction positions on the substrate.

As can be seen from FIG. 3, an image of the functional feature is exposed in the resist, the functional feature image extending from −25 nm to +25 nm (the center of the exposed functional feature image is considered to be the zero-point in the x-direction). The image of the functional feature is referred to hereafter as the functional feature image 110. In addition however, the assist features are also exposed in the resist, the assist feature images being located at around −115 nm and +115 nm. The images of the assist features are referred to hereafter as assist feature images 112. As noted further above, the formation of assist feature images 112 is undesirable because the assist features are not intended to form part of a pattern exposed on the substrate W.

An embodiment of the invention prevents or reduces printing of an assist feature image. The phase modification acts to reduce the contrast of radiation received at the substrate from the assist feature such that the radiation falls below a threshold of the resist, thereby preventing or reducing printing of assist feature image. An embodiment of the invention reduces the size of printed assist feature image by reducing the contrast of radiation received at the substrate. The term 'contrast' may be interpreted as meaning the difference between the maximum and minimum radiation dose delivered to the resist divided by the sum of the maximum and minimum radiation dose delivered to the resist. This may be represented as (DoseMax−DoseMin)/(DoseMax+DoseMin), where DoseMax is the maximum radiation dose delivered to the resist and DoseMin is the minimum radiation dose delivered to the resist.

Although printing of the assist feature image is prevented (or the size of the assist feature image is reduced), radiation which forms the assist feature image is still present and thus provides image enhancement of the functional feature image (e.g. helping to ensure that the functional feature image has a desired width). If the radiation which forms the assist feature image were to be completely removed then the assist feature would provide no image enhancement of the functional feature image. Therefore, the phase modification reduces the contrast of the radiation which forms the assist feature image and does not completely eliminate the contrast. The reduction of the contrast may be sufficient to prevent printing of the assist feature image or may reduce the size of printed assist feature image.

Figure 4:
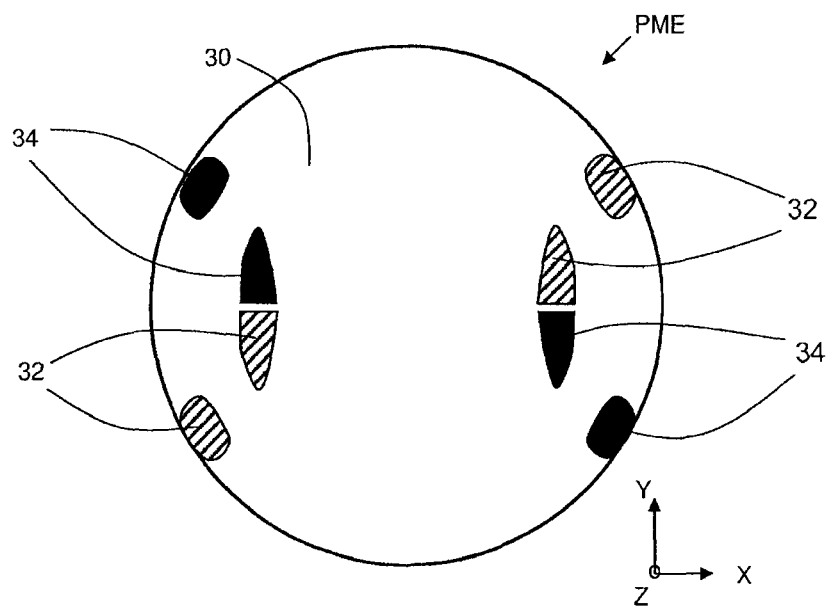
FIG. 4 schematically depicts phase modifications applied to radiation by an optical phase adjustment apparatus according to an embodiment of the invention.

FIG. 4 represents schematically phase modifications which are applied by an optical phase adjustment apparatus PME to radiation in the projection system PL of the lithographic apparatus (see FIG. 1). The optical phase adjustment apparatus PME is located at or adjacent to a pupil plane PP of the lithographic apparatus. In FIG. 4 the optical phase adjustment apparatus PME is configured such that the majority of the optical phase adjustment apparatus applies no phase modification to the radiation. Areas of the optical phase adjustment apparatus PME which apply no phase modification are indicated by empty shading 30 in FIG. 4. There are four areas 32 of the optical phase adjustment apparatus PME which decrease the optical path length of radiation by around 10 nm. This is achieved by heating those areas 32 relative to the area 30 which applies no phase modification (as is explained further below), to change the refractive index of those areas. The areas 32 which increase the radiation optical path length are referred to hereafter as phase advancing areas 32. The area 30 which applies no phase modification is referred to hereafter as the neutral area. Radiation which passes through the phase advancing areas 32 has a phase which is advanced by around 10 nm relative to radiation which passes through the neutral area 30.

The optical phase adjustment apparatus PME includes four areas 34 which are configured to increase the optical path length of radiation by around 10 nm (compared with the optical path length of radiation which passes through the neutral area 30). This is achieved by cooling those areas 34 relative to the neutral area 30. The areas 34 which increase the optical path length of radiation by around 10 nm are referred to hereinafter as the phase delaying areas 34. Radiation which passes through the phase delaying areas 34 has a phase which is delayed by around 10 nm relative to radiation which passes through the neutral area 30.

The phase delaying areas 34 and the phase advancing areas 32 are positioned such that they affect substantially only 3rd order diffracted radiation (i.e., they have a negligible effect on 0, 1st and 2nd order diffracted radiation). The positions of the phase delaying and phase advancing areas 34, 32 arise from the annular nature of the illumination mode used by the lithographic apparatus and the nature of the pattern and assist feature(s) 10, 12. The phase delaying and advancing areas 34, 32 are generated by considering all areas which receive 3rd order diffracted radiation and then subtracting from this areas which receive zero, 1st or 2nd order diffracted radiation. In this instance, the areas which receive 3rd order diffracted radiation comprise two vertically oriented arcs. The zero order radiation comprises a ring which intersects with the arcs. Since it is not desired to modify the phase of zero order radiation, the ring is subtracted from the areas which receive 3rd order diffracted radiation. In addition, a line which bisects the curves is also applied, thereby removing a small portion from the center of each curve. This is present because the phase modification should be zero for a pattern which is antisymmetric about the x-axis (as is the case in this embodiment). The resulting phase modifying areas comprise two arcs, each of which has been separated into four pieces. One half of each arc comprises phase delaying areas 34 and the other half comprises phase advancing areas 32.

The optical phase adjustment apparatus PME shown in FIG. 4 advances the phase of some 3rd order diffracted radiation by around 10 nm and delays the phase of some 3rd order diffracted radiation by around 10 nm. As a result, a phase difference of around 20 nm is established between 3rd order diffracted radiation which passes through different areas of the optical phase adjustment apparatus. Referring again to FIG. 2, it may be seen that the functional feature 10 is significantly wider than the assist features 12. This difference in width is such that radiation which is diffracted from the functional feature 10 has a negligible 3rd diffraction order component, whereas radiation which is diffracted from the assist features 12 is predominantly 3rd order diffracted radiation. As a result, the phase modification applied by the optical phase adjustment apparatus PME has a lesser effect on radiation which has been diffracted from the functional feature 10 (compared with the effect on radiation which has been diffracted from the assist features 12). The phase modification applied by the optical phase adjustment apparatus PME may have a negligible effect on radiation which has been diffracted from the functional feature 10. The phase modification applied by the optical phase adjustment apparatus may have a negligible effect upon a functional feature image 110 exposed in the resist on the substrate.

The phase modification applied by the optical phase adjustment apparatus PME reduces the modulation depth of 3rd order diffracted radiation at the substrate W. To facilitate conceptual understanding, this may be visualized as a movement to the left of components of 3rd order diffracted radiation which pass through the phase advancing areas 32 and movement to the right of 3rd order diffracted radiation components which pass through the phase delaying areas 34. The effect of these movements is to reduce the depth of modulation when the 3rd order diffracted radiation components are added together. The modulation of the 3rd order diffracted radiation is washed out to some extent.

At the substrate, the 3rd order diffracted radiation and zero order radiation interact, generating high spatial frequency radiation components. Because the depth of modulation of the 3rd order diffracted radiation has been reduced, the contrast of the high frequency radiation components arising from the interaction of 3rd order diffracted radiation and zero order radiation is reduced. The reduced contrast reduces the size of the assist feature image. If the reduction of the contrast is such that the threshold of the resist is not crossed, then the assist feature image will not be formed in the resist. Since the effect of the optical phase adjustment apparatus PME on the radiation diffracted from the functional feature is negligible (as explained further above), the functional feature image is formed as desired on the substrate. Since some 3rd order diffracted radiation modulation is retained (the phase modification does not fully eliminate 3rd order diffracted radiation modulation), the 3rd order diffracted radiation provides image enhancement of the functional feature image. In other words, the assist feature image is still present (although it provides a reduced dose of radiation), and provides image enhancement of the functional feature image.

Figure 5:
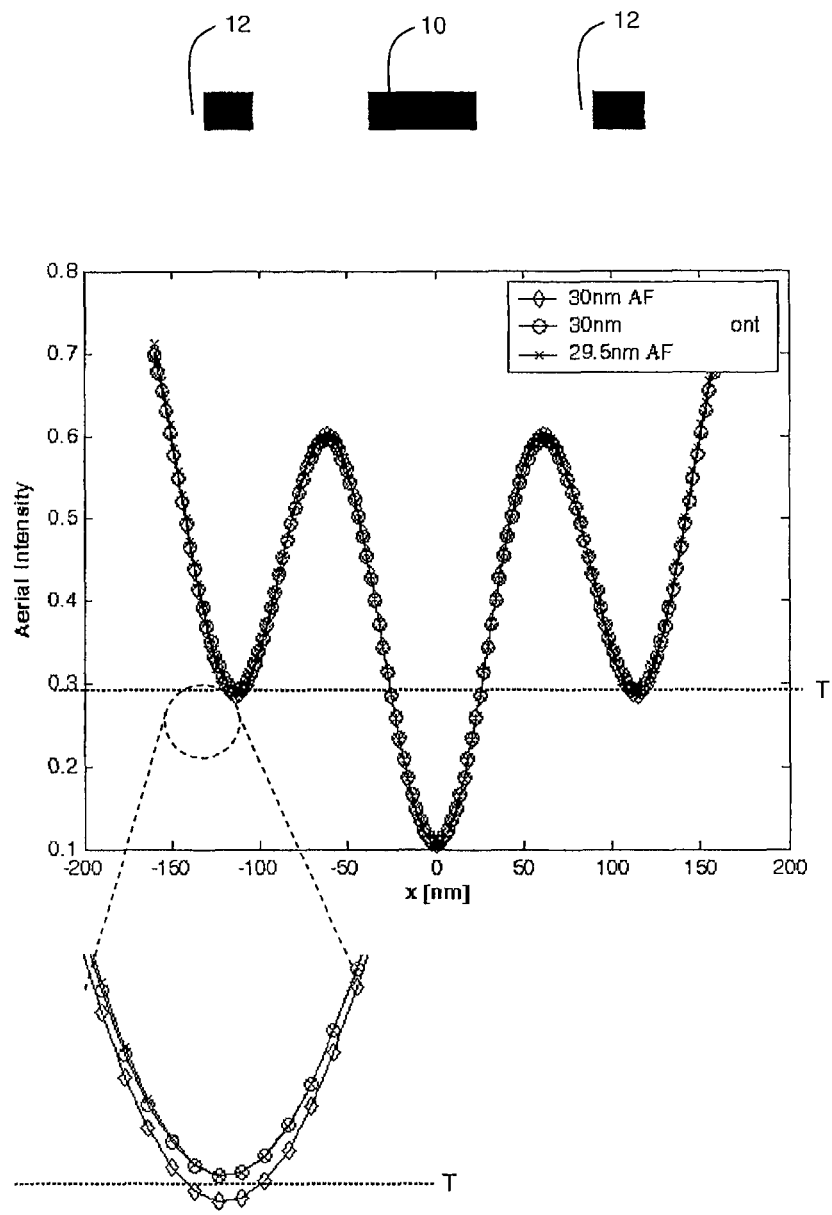
FIG. 5 schematically shows the effect of a functional feature and an assist feature upon radiation aerial intensity in when an embodiment of the invention is used.

FIG. 5 is a graph generated using modelling which illustrates the reduced contrast which is provided by introducing a phase difference into the 3rd order diffracted radiation. At the top of FIG. 5 the functional feature 10 and assist features 12 are shown. Beneath this the aerial intensity of radiation incident at a substrate after patterning by the functional feature 10 and assist features 12 is shown. As may be seen, the intensity of radiation at the substrate drops to a very low value (around 0.1) at a substrate location which corresponds with the functional feature 10. The threshold T of resist on the substrate is indicated by a dotted line in FIG. 5. In this example the resist on the substrate is positive resist. The radiation intensity crosses the threshold T at a location which corresponds with the functional feature 10, and a functional feature image will therefore be formed in the resist.

The threshold T of the resist is similar to the minimum aerial intensity seen at locations which correspond with the assist features 12. In order to allow the effect of introducing a phase difference to be seen, part of the aerial intensity data is shown in an enlarged form at the bottom of FIG. 5 (as is the threshold T). The diamonds represent data points which were generated for assist features having a width of 30 nm on the substrate W side of the projection system PL (i.e. a width of 120 nm on the patterning device MA side of the projection system). These data points were generated without introducing a phase difference to the 3rd order diffracted radiation. As may be seen from FIG. 5 the aerial intensity of the radiation crosses the threshold T, and as a result an assist feature image will be formed in the resist.

The circles represent data points which were generated for the same assist features but with a phase difference of 20 nm having been introduced into the 3rd order diffracted radiation. As may be seen from FIG. 5, the aerial intensity of the radiation does not cross the threshold T (the contrast of the radiation has been reduced). As a result, the assist feature image will not be printed in the resist. Although the assist feature image is not printed in the resist, the assist feature image is nevertheless present in the resist during exposure of the functional feature image, and therefore provides image enhancement of the functional feature image.

If the threshold T were to have a higher value then the assist feature image would be printed in the resist. However, the assist feature image would be smaller than would be the case if the phase difference had not been applied.

The crosses represent data points which were generated for assist features having a width of 29.5 nm on the substrate side of the projection system PL. As may be seen from FIG. 5, the aerial intensity of the radiation does not cross the threshold T, and as a result the assist feature image will not be printed in the resist. The aerial intensity seen for the smaller assist features corresponds closely with the aerial intensity seen when the phase difference is introduced into the third order diffracted radiation. This indicates that the effect of introducing the phase difference is similar to reducing the size of the assist feature.

Although FIG. 5 illustrates an embodiment of the invention being used in connection with positive resist, an embodiment of the invention may be used in connection with negative resist.

Although the phase modifying areas shown in FIG. 4 have a particular distribution, phase modifying areas with other distributions may be used. For example, the phase modifying areas shown in FIG. 4 may be subdivided into halves, each of which may for example have a phase advancing area and a phase delaying area. For example, any suitable phase modifying distribution may be provided within the areas shown in FIG. 4. For example, other distributions which are point-symmetric, or distributions which are point-antisymmetric may be used. In addition, distributions which are a combination of a point-symmetric phase modifying area distribution and a point-antisymmetric phase modifying area distribution may be used.

Figure 6:
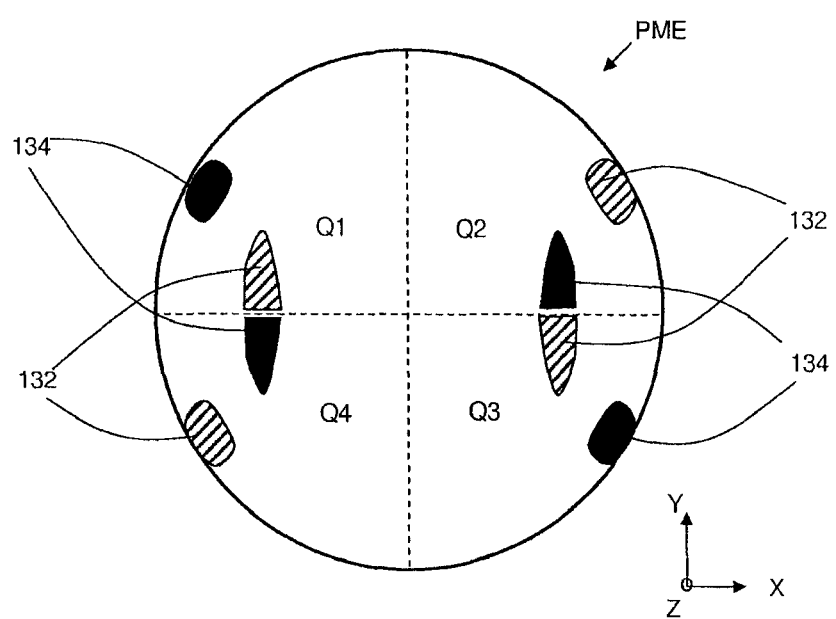
FIG. 6 schematically depicts alternative phase modifications applied to radiation by an optical phase adjustment apparatus according to an embodiment of the invention.

An example of another point-symmetric distribution which may be used is shown schematically in FIG. 6. For ease of description, the optical phase adjustment apparatus PME is separated into four quadrants Q1-Q4 in FIG. 6. Each quadrant Q1-Q4 includes a phase delaying area 134 and a phase advancing area 132. In common with the distribution shown in FIG. 4, the phase delaying and advancing areas are arranged such that they primarily affect 3rd order diffracted radiation and have a negligible effect upon diffracted radiation of other orders.

Figure 7:
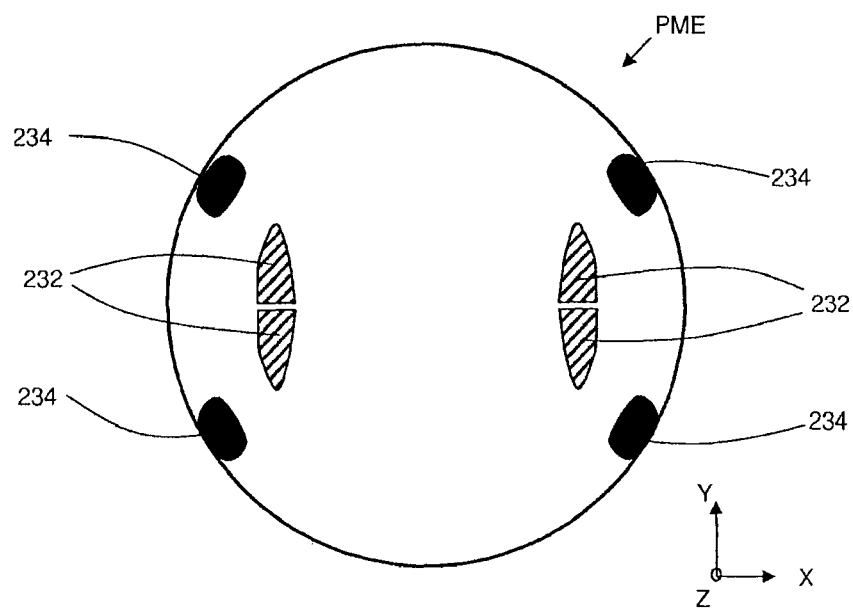
FIG. 7 schematically depicts alternative phase modifications applied to radiation by an optical phase adjustment apparatus according to an embodiment of the invention.

Another example of a point-symmetric distribution which may be used is shown schematically in FIG. 7. In this distribution phase advancing areas 232 are located in an outer part of the optical phase adjustment apparatus PME, and phase delaying areas 234 are located away from the outer part of the optical phase adjustment apparatus. In common with the distribution shown in FIG. 4, the phase delaying and advancing areas are arranged such that they primarily affect 3rd order diffracted radiation and have a negligible effect upon diffracted radiation of other orders.

Figure 8:
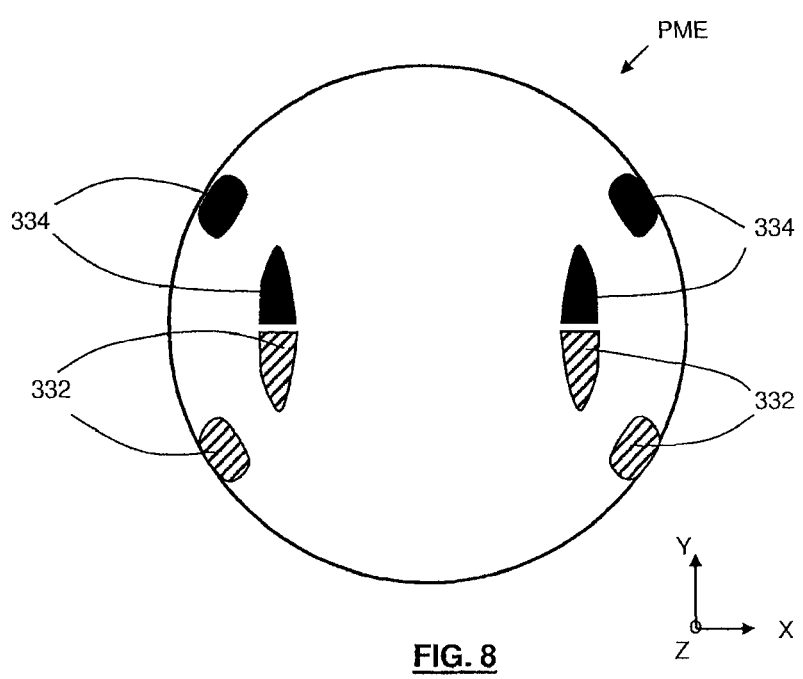
FIG. 8 schematically depicts alternative phase modifications applied to radiation by an optical phase adjustment apparatus according to an embodiment of the invention.

An example of a point-antisymmetric distribution which may be applied to the optical phase adjustment apparatus PME is shown schematically in FIG. 8. In the distribution of FIG. 8 phase advancing areas 332 are provided in one half of the optical phase adjustment apparatus PME, and phase delaying areas 334 are provided in the other half of the optical phase adjustment apparatus. In common with the distribution shown in FIG. 4, the phase delaying and advancing areas are arranged such that they primarily affect 3rd order diffracted radiation and have a negligible effect upon diffracted radiation of other orders.

Figure 9:
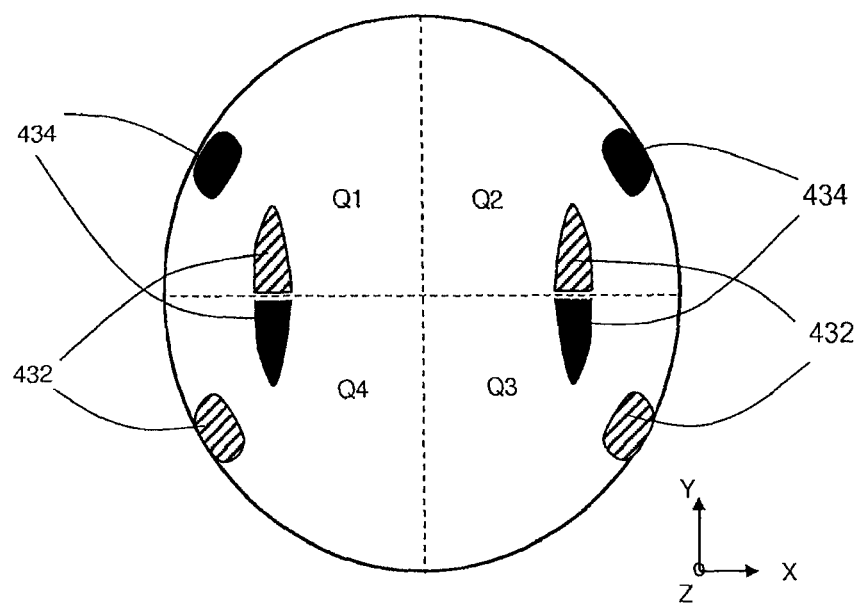
FIG. 9 schematically depicts alternative phase modifications applied to radiation by an optical phase adjustment apparatus according to an embodiment of the invention.

An example of another point-antisymmetric distribution which may be used is shown schematically in FIG. 9. For ease of description, the optical phase adjustment apparatus PME is separated into four quadrants Q1-Q4 in FIG. 9. Each quadrant Q1-Q4 includes a phase delaying area 434 and a phase advancing area 432. In common with the distribution shown in FIG. 4, the phase delaying and advancing areas are arranged such that they primarily affect 3rd order diffracted radiation and have a negligible effect upon diffracted radiation of other orders.

The optical phase adjustment apparatus PME may include a controller (not illustrated in FIGS. 1 to 9) which is configured to control operation of the optical phase adjustment apparatus. The controller may be configured to operate the optical phase adjustment apparatus PME to apply a distribution of phase delaying and phase advancing areas. The distribution of phase delaying and phase advancing areas may be as shown in any of FIGS. 4, 6-9, or may be any other suitable distribution.

In the illustrated embodiments the same phase delay is applied by each phase delaying area, the phase delay being substantially constant across each phase delaying area. Similarly, the same phase advance is applied by each phase advancing area, the phase advance being substantially constant across each phase advancing area. However, one or more phase delaying areas may apply a different phase delay than one or more other phase delaying areas. Furthermore, the phase delay may vary across a phase delaying area. Similarly, one or more phase advancing areas may apply a different phase advance than one or more other phase advancing areas. Furthermore, the phase advance may vary across a phase advancing area.

Each phase delaying area may be paired with an associated phase advancing area. A phase delaying and phase advancing area pair may form part of a point-symmetric distribution or may form part of a point-antisymmetric distribution. The phase advancing area may be configured to apply a phase advance which is equal to (although opposite in sign from) the phase delay which will be applied by the phase delaying area. Thus, for example if the phase advancing area applies a phase advance which changes gradually from 5 to 10 nm, then the associated phase delaying area should apply a phase delay which changes gradually from −5 to −10 nm. Useful distributions of pairs of phase delaying and phase advancing areas comprise pairs which have either radial symmetry or symmetry about an x or y-axis. It is not necessary however for phase delaying and phase advancing areas to be paired.

The distribution of phase modifying areas may be such that it does not cause a significant shift in the x or y directions (or a combination of these) of a projected pattern image. If the sum of the phase modification applied by all of the modifying areas of the optical phase adjustment apparatus PME is zero then this may be achieved. In some instances, if the shift applies only to an assist feature image (and has no significant effect upon a pattern feature image), then a shift may be acceptable since in some embodiments the assist feature image will not be printed in the resist.

Although the above description relates to applying phase modifications to 3rd order diffracted radiation, phase modifications may be applied to radiation of other diffraction orders. Phase modifications may, for example, be applied to a different diffraction order (in addition to or instead of the 3rd order) in order to prevent an assist feature being printed or to reduce the size of a printed assist feature.

The selection of a diffraction order to which a phase modification is to be applied may be determined by illuminating an assist feature then measuring the amplitude of different diffraction orders of radiation projected by the projection system (or using modelling to obtain the same information). In the above embodiments the amplitude of 3rd order radiation diffracted from an assist feature is significantly greater than the amplitude of 1st, 2nd or 4th order radiation diffracted from an assist feature. Furthermore, the amplitude of 3rd order radiation decreases as the width of the illuminated assist feature is reduced. This indicates that reducing the modulation depth of 3rd order radiation will effectively reduce the width of an assist feature image (and may even prevent printing of an assist feature image). This is confirmed by the simulation shown in FIG. 5.

In an embodiment, a diffraction order which has a relatively large amplitude (e.g. larger than the amplitude of some other diffraction orders) may be selected as the diffraction order to which a phase modification is to be applied. The diffraction order which has the largest amplitude (not including the zero-order) may be selected as the diffraction order to which a phase modification is to be applied.

The amplitude of different diffraction orders of radiation projected by the projection system when a functional feature is illuminated may be measured. In the above embodiments the amplitude of 3rd order radiation diffracted from the functional feature is negligible. In the above embodiments therefore, modifying the 3rd diffraction order will have a significant effect on the assist feature image but a negligible effect on functional feature image. Hence, the 3rd diffraction order is selected for phase modification. In other embodiments one or more other diffraction orders may be a suitable candidate for phase modification. For example, another diffraction order may provide a significant contribution to an assist feature image and may provide a smaller contribution to a functional feature image. A diffraction order may be identified which has a significant effect upon the assist feature image and which has a smaller effect upon the functional feature image. A diffraction order may be identified which has a significant effect upon the assist feature image and which has a negligible effect upon the functional feature image.

The optical phase adjustment apparatus PME may be configured such that a phase modification is applied to radiation of a particular diffraction order, and is not applied to a significant proportion of radiation of one or more other diffraction orders. In this context, the term 'is not significantly applied to radiation of one or more other diffraction orders' may be interpreted as meaning that radiation of one or more other diffraction orders is not significantly affected by the phase modification. Consequently, an image feature formed using such diffraction order(s) may be not significantly affected (e.g. the image feature may provide desired functionality and/or may have a dimension which falls within a predefined tolerance).

Although the above described embodiments of the invention relate to annular illumination modes, embodiments of the invention may be applied to radiation having any suitable illumination mode.

In the above described examples a phase difference of around 20 nm has been introduced into the 3rd order radiation. This phase difference was selected because it was sufficient to prevent the printing of assist feature images (by reducing the contrast of the radiation so that the threshold of the resist was not exceeded). In that case the wavelength of the radiation was 193 nm, the pattern and assist features had the dimensions mentioned above, and the illumination mode was an annular illumination mode. The numerical aperture of the projection system PL was 1.2, and the radiation was linearly polarized with two opposite quadrants having x-direction polarization and two opposite quadrants having y-direction polarization. A different phase difference may be applied when operating with different parameters (e.g. when using an assist feature having a different width). A phase difference may be selected which reduces the dose of radiation that is diffracted from an assist feature and received on a substrate target portion. The phase difference may be such that the assist feature is not printed.

Figure 10:
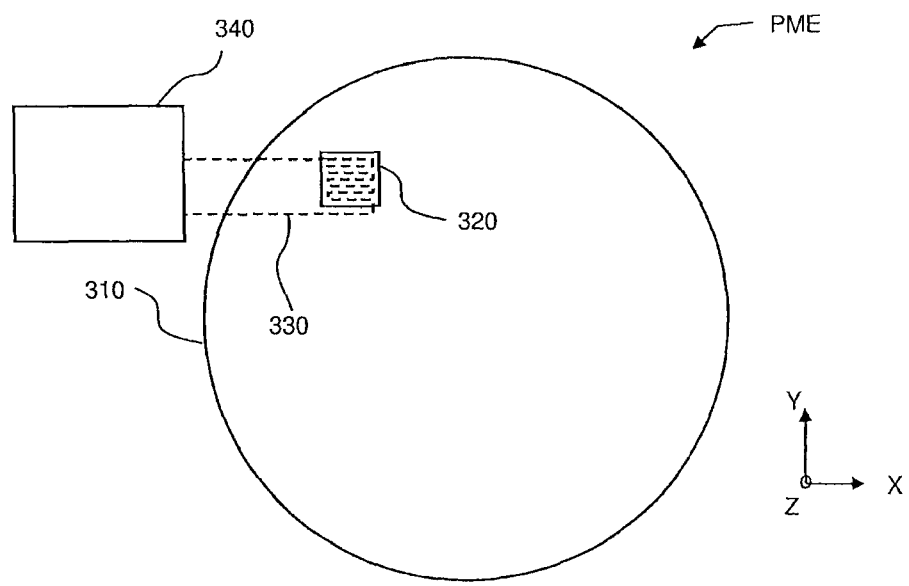
FIG. 10 schematically depicts an optical phase adjustment apparatus according to an embodiment of the invention.

An example of the optical phase adjustment apparatus PME is shown schematically, viewed from above, in FIG. 10. The optical phase adjustment apparatus PME may comprise an optical element 310 of a material substantially transmissive for the radiation which is projected by the projection system. The optical phase adjustment apparatus PME may further comprise a controller 340. An optical path length for radiation traversing the element 310 is adjustable in response to a signal supplied by controller 340. The optical element 310 may be disposed or disposable, for example, substantially in a Fourier Transform plane such as a pupil plane PP of the projection system PL (see FIG. 1).

Figure 11:
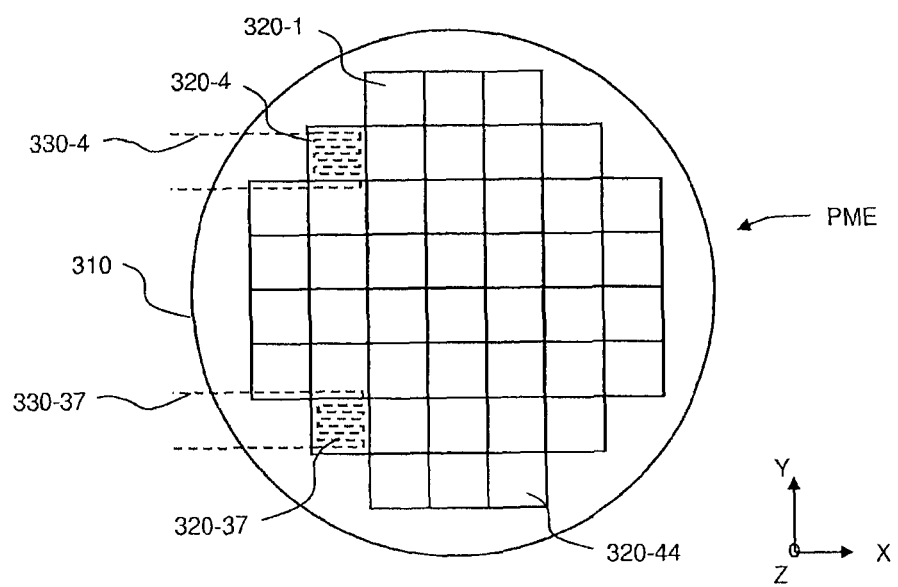
FIG. 11 also schematically depicts an optical phase adjustment apparatus according to an embodiment of the invention.

FIG. 11 illustrates the optical phase adjustment apparatus PME in more detail, viewed from above along the optical axis of the projection system (conventionally indicated as the z-axis). The optical phase adjustment apparatus PME comprises a transmissive optical element 310. An adjustment of the phase of radiation traversing the optical element 310 may be obtained by, for example, applying heat to, or removing heat from, a portion 320 of the optical element 310, thereby introducing a local change of index of refraction of the material of the optical element relative to the refractive index of adjacent material. The application of heat can be realized by, for example, transmitting an electrical current through a wire 330 having Ohmic resistance and being arranged in contact with or adjacent the portion 320 of the element and with a controller 340 arranged to provide the current to the wire 330.

A plurality of adjacent portions of the optical element may be provided with a corresponding plurality of wires for heating any portion independently from any other portion. For example, as schematically illustrated in FIG. 11, adjacent portions 320-1 up to 320-44 are disposed in adjacent rows and numbered from left to right and from top to bottom. Each portion 320 of the portions 320-1 up to 320-44 is provided with correspondingly numbered heating wires 330-1 up to 330-44 (although FIG. 11, merely for clarity sake, illustrates this only for the portions 320-4 and 320-37). The controller 340 is constructed and arranged such that each wire can be current-activated independently. This enables a desired phase modification to be applied at desired spatial locations to radiation traversing the optical element 310. The magnitude of the phase modification(s) and their spatial distribution are determined by the temperatures of the portions 320-1 to 320-44.

In addition or alternatively, the optical element 310 may include a channel arranged to contain a cooling or heating fluid. The optical phase adjustment apparatus PME may include a cooling or heating fluid supply and retrieval system connected to the channel and arranged to circulate cooling or heating fluid at a controlled temperature through the channel. Like the wires 330, a channel may be associated with each portion 320. For example, a cooling of the element 310 in combination with heating a portion 320 of the element 310 may enable adjusting the temperature of the portion 320 within a range of temperatures extending both below and/or above a nominal temperature. The nominal temperature may, for example, be a specified desired operating temperature of the lithographic apparatus or of the material of optical elements of the projection system PL. The neutral area 30 (see FIG. 4) of the optical element 310 may be at the nominal temperature.

The controller 340 may, for example, comprise a processor, or may be some other suitable apparatus. The controller may have a memory within which is stored the current to be supplied to different heating wires in order to obtain particular spatial configurations of phase modifications and/or temperatures applied to heating or cooling fluid in order to obtain particular spatial configurations of phase modifications. The controller may be configured to refer to this memory as required. If a mechanism other than Ohmic heating (or in addition to Ohmic heating) is used to obtain the phase modifications then information which indicates how this mechanism should be applied in order to obtain particular spatial configurations of phase modifications may be stored in the memory.

The optical element 310 may be one of a pair of optical elements, each of the optical elements being provided with portions to which heat may be added or removed. The portions on a first optical element may be staggered relative to the portions on a second optical element. A gap may be provided between the pair of optical elements. Gas may be passed through the gap, the gas having a desired temperature (e.g. the nominal temperature).

Embodiments of a optical phase adjustment apparatus PME can be gleaned from U.S. Pat. No. 7,525,640, which is herein incorporated by reference. The total number of portions 320 is not limited to 44. Instead, any number of portions may be used. The number of portions may in general depend on a desired spatial resolution of the temperature distribution. This may depend upon the spatial resolution of patterns which are to be applied by the optical phase adjustment apparatus PME. For example, up to 100 portions or up to 1000 portions or more may be provided. A pattern to be applied by the optical phase adjustment apparatus PME may be designed to have a spatial resolution which corresponds with the spatial resolution of the optical phase adjustment apparatus PME.

The optical phase adjustment apparatus PME will have a finite width. Consequently, it may not be possible for the optical phase adjustment apparatus PME to be perfectly located at the pupil plane PP. Part of the optical phase adjustment apparatus PME may be located in the pupil plane PP, with part of the optical phase adjustment apparatus being located adjacent to the pupil plane. In an embodiment, the entire optical phase adjustment apparatus PME may be located adjacent to the pupil plane. In this context the term 'adjacent to the pupil plane' may be considered to mean sufficiently close to the pupil plane that there is negligible difference between phase adjustments applied by the optical phase adjustment apparatus and phase adjustments that would have been applied if the optical phase adjustment apparatus was in the pupil plane.

The above described embodiments of the invention have described a transmissive optical element 310. However, in an embodiment, the optical phase adjustment apparatus may comprise a reflective optical element.

The above description refers to the optical phase modification apparatus PME having a negligible effect on radiation diffracted from a functional feature. In this context the term 'negligible effect' may be considered to mean that the effect is sufficiently small that a functional feature is correctly exposed in resist (e.g. will function correctly in an IC or other device, or has dimensions which fall within a tolerance). References to the phase modification applied by the optical phase adjustment apparatus having a negligible effect upon a functional feature image exposed in the resist on the substrate may be interpreted in a corresponding manner.

Embodiments of the invention may cause defocus or contrast loss of an assist feature image. Distributions of phase modifications which may be used include a bowl shape fit through the diffraction orders, a distribution comprising half of a bowl shape and half of an inverted bowl shape, or a tilt applied relative to the x-direction for half of the pupil and a tilt applied relative to the y-direction for the other half of the pupil.

References in this document to the x and y-directions (or axes) may be understood to mean directions (or axes) which are perpendicular to the optical axis of the lithographic apparatus. The x and y axes may have any suitable orientation relative to the optical axis.

While the description herein has focused on an assist feature image exposed in resist on a substrate, the assist feature image may be projected on other surfaces or other materials and similarly be phase adjusted.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The invention may further be described using the following clauses:

1. A method of projecting a pattern from a patterning device onto a substrate using a projection system, the method comprising using an optical phase adjustment apparatus in the projection system to apply a phase modification to radiation which has been diffracted from an assist feature of the pattern, the phase modification acting to reduce the size of an assist feature image exposed in resist on the substrate or prevent printing of the assist feature image in the resist on the substrate, while maintaining a contribution of the assist feature image to an image enhancement of a functional feature of the pattern.

2. A method of projecting a pattern from a patterning device onto a substrate using a projection system, the method comprising using an optical phase adjustment apparatus in the projection system to apply a phase modification to radiation which has been diffracted from an assist feature of the pattern, the phase modification acting to reduce the size of an assist feature image exposed in resist on the substrate or prevent printing of the assist feature image in the resist on the substrate, wherein the phase modification has a lesser effect upon radiation which has been diffracted from a functional feature of the pattern.

3. The method of clause 1 or clause 2, wherein the phase modification reduces contrast at the substrate of the radiation diffracted from the assist feature.

4. The method of any of clauses 1 to 3, wherein the phase modification applied by the optical phase adjustment apparatus has a lesser effect on radiation which has been diffracted from the functional feature.

5. The method of any preceding clause, wherein the phase modification applied by the optical phase adjustment apparatus has a negligible effect upon the functional feature image exposed in the resist on the substrate.

6. The method of any preceding clause, wherein the phase modification is applied to radiation of a particular diffraction order, and is not significantly applied to radiation of one or more other diffraction orders.

7. The method of clause 6, wherein the particular diffraction order is the 3rd diffraction order.

8. The method of any preceding clause, wherein the phase modification comprises reducing the optical path length of radiation which passes through a phase advancing area of the optical phase adjustment apparatus and increasing the optical path length of radiation which passes through a phase delaying area of the optical phase adjustment apparatus.

9. The method of clause 8, wherein the optical path length reduction applied by the phase advancing area is substantially equal to the optical path length increase applied by the phase delaying area.

10. The method of clause 8, wherein the optical path length reduction varies within the phase advancing area, and the optical path length increase varies within the phase delaying area.

11. The method of any of clauses 8 to 10, wherein phase advancing areas and phase delaying areas are provided in pairs.

12. The method of any of clauses 8 to 11, wherein the sum of the phase modification applied by all of the modifying areas of the optical phase adjustment apparatus is substantially zero.

13. The method of any of clauses 8 to 12, wherein phase advancing areas and phase delaying areas are provided in a point-symmetric distribution or in a point-antisymmetric distribution.

14. A lithographic apparatus comprising an optical phase adjustment apparatus configured to apply a method according to any preceding clause.

15. A lithographic apparatus comprising
a support structure to support a patterning device, the patterning device serving to provide a radiation beam with a pattern in its cross-section;
a projection system to project the patterned radiation beam onto a target portion of a substrate;
an optical phase adjustment apparatus located at or adjacent to a pupil plane of the projection system; and
a controller configured to operate the optical phase adjustment apparatus to apply a phase modification to radiation which has been diffracted from an assist feature of the pattern, the phase modification acting to reduce the size of an assist feature image exposed in resist on the substrate or prevent printing of the assist feature image in the resist on the substrate, while maintaining a contribution of the assist feature image to an image enhancement of a functional feature of the pattern.

16. The apparatus of clause 15, wherein the phase modification is configured to reduce contrast at the substrate of the radiation diffracted from the assist feature.

17. The apparatus of clause 15 or clause 16, wherein the phase modification applied by the optical phase adjustment apparatus has a lesser effect on radiation which has been diffracted from the functional feature.

18. The apparatus of any of clauses 15 to 17, wherein the controller is configured to operate the optical phase adjustment apparatus to apply the phase modification to radiation of a particular diffraction order, and to not significantly apply the phase modification to radiation of one or more other diffraction orders.

19. The apparatus of clause 18, wherein the particular diffraction order is the 3rd diffraction order.

20. The apparatus of any of clauses 15 to 19, wherein the phase modification comprises reducing the optical path length of radiation which passes through a phase advancing area of the optical phase adjustment apparatus and increasing the optical path length of radiation which passes through a phase delaying area of the optical phase adjustment apparatus.

21. The apparatus of clause 20, wherein the optical path length reduction applied by the phase advancing area is substantially equal to the optical path length increase applied by the phase delaying area.

22. The apparatus of clause 20 or clause 21, wherein phase advancing areas and phase delaying areas are provided in pairs.

23. The apparatus of any of clauses 20 to 22, wherein the sum of the phase modification applied by all of the modifying areas of the optical phase adjustment apparatus is substantially zero.

24. The apparatus of any of clauses 20 to 23, wherein phase advancing areas and phase delaying areas are provided in a point-symmetric distribution or in a point-antisymmetric distribution.

The descriptions above are intended to be illustrative, not limiting. Thus, it will be apparent to one skilled in the art that modifications may be made to the invention as described without departing from the scope of the claims set out below.

The invention claimed is:

1. A method of projecting a pattern from a patterning device onto a substrate using a projection system, the method comprising using an optical phase adjustment apparatus in the projection system to apply a phase modification to radiation which has been diffracted from an assist feature of the pattern, the phase modification acting to reduce the size of an assist feature image exposed in resist on the substrate or prevent printing of the assist feature image in the resist on the substrate, while maintaining a contribution of the assist feature image to an image enhancement of a functional feature of the pattern.

2. The method of claim 1, wherein the phase modification reduces contrast at the substrate of the radiation diffracted from the assist feature.

3. The method of claim 1, wherein the phase modification applied by the optical phase adjustment apparatus has a negligible effect upon the functional feature image exposed in the resist on the substrate.

4. The method of claim 1, wherein the phase modification is applied to radiation of a particular diffraction order, and is not significantly applied to radiation of one or more other diffraction orders.

5. The method of claim 4, wherein the particular diffraction order is the 3rd diffraction order.

6. The method of claim 1, wherein the phase modification comprises reducing the optical path length of radiation which passes through a phase advancing area of the optical phase adjustment apparatus and increasing the optical path length of radiation which passes through a phase delaying area of the optical phase adjustment apparatus.

7. The method of claim 6, wherein the optical path length reduction varies within the phase advancing area, and the optical path length increase varies within the phase delaying area.

8. The method of claim 6, wherein phase advancing areas and phase delaying areas are provided in pairs.

9. The method of claim 6, wherein phase advancing areas and phase delaying areas are provided in a point-symmetric distribution or in a point-antisymmetric distribution.

10. A lithographic apparatus comprising an optical phase adjustment apparatus configured to apply a method according to claim 1.

11. A method of projecting a pattern from a patterning device onto a substrate using a projection system, the method comprising using an optical phase adjustment apparatus in the projection system to apply a phase modification to radiation which has been diffracted from an assist feature of the pattern, the phase modification acting to reduce the size of an assist feature image exposed in resist on the substrate or prevent printing of the assist feature image in the resist on the substrate, wherein the phase modification has a lesser effect upon radiation which has been diffracted from a functional feature of the pattern.

12. A lithographic apparatus comprising a support structure to support a patterning device, the patterning device serving to provide a cross-section of a radiation beam with a pattern;

a projection system to project the patterned radiation beam onto a target portion of a substrate;

an optical phase adjustment apparatus located at or adjacent to a pupil plane of the projection system; and a controller configured to operate the optical phase adjustment apparatus to apply a phase modification to radiation which has been diffracted from an assist feature of the pattern, the phase modification acting to reduce the size of an assist feature image exposed in resist on the substrate or prevent printing of the assist feature image in the resist on the substrate, while maintaining a contribution of the assist feature image to an image enhancement of a functional feature of the pattern.

13. The apparatus of claim 12, wherein the phase modification is configured to reduce contrast at the substrate of the radiation diffracted from the assist feature.

14. The apparatus of claim 12, wherein the phase modification applied by the optical phase adjustment apparatus has a lesser effect on radiation which has been diffracted from the functional feature.

15. The apparatus of claim 12, wherein the controller is configured to operate the optical phase adjustment apparatus to apply the phase modification to radiation of a particular diffraction order, and to not significantly apply the phase modification to radiation of one or more other diffraction orders.

16. The apparatus of claim 15, wherein the particular diffraction order is the 3rd diffraction order.

17. The apparatus of claim 12, wherein the phase modification comprises reducing the optical path length of radiation which passes through a phase advancing area of the optical phase adjustment apparatus and increasing the optical path length of radiation which passes through a phase delaying area of the optical phase adjustment apparatus.

18. The apparatus of claim 17, wherein the optical path length reduction applied by the phase advancing area is substantially equal to the optical path length increase applied by the phase delaying area.

19. The apparatus of claim 17, wherein the sum of the phase modification applied by all of the modifying areas of the optical phase adjustment apparatus is substantially zero.

20. The apparatus of claim 17, wherein phase advancing areas and phase delaying areas are provided in a point-symmetric distribution or in a point-antisymmetric distribution.

* * * * *